US012320030B2

(12) United States Patent
Kaneko et al.

(10) Patent No.: US 12,320,030 B2
(45) Date of Patent: Jun. 3, 2025

(54) METHOD OF USING SIC CONTAINER

(71) Applicants: KWANSEI GAKUIN EDUCATIONAL FOUNDATION, Nishinomiya (JP); TOYOTA TSUSHO CORPORATION, Nagoya (JP)

(72) Inventors: Tadaaki Kaneko, Sanda (JP); Yasunori Kutsuma, Sanda (JP); Koji Ashida, Sanda (JP); Ryo Hashimoto, Sanda (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 0 days.

(21) Appl. No.: 18/380,897

(22) Filed: Oct. 17, 2023

(65) Prior Publication Data

US 2024/0044042 A1 Feb. 8, 2024

Related U.S. Application Data

(62) Division of application No. 17/734,511, filed on May 2, 2022, now abandoned, which is a division of
(Continued)

(30) Foreign Application Priority Data

Apr. 28, 2016 (JP) .................. 2016-092073

(51) Int. Cl.
*C30B 29/36* (2006.01)
*C30B 23/02* (2006.01)
(Continued)

(52) U.S. Cl.
CPC .......... *C30B 23/063* (2013.01); *C30B 23/025* (2013.01); *C30B 29/36* (2013.01);
(Continued)

(58) Field of Classification Search
CPC ....... C30B 23/02; C30B 23/025; C30B 23/06; C30B 23/063; C30B 29/36; C30B 35/002;
(Continued)

(56) References Cited

U.S. PATENT DOCUMENTS 4,649,002 A * 3/1987 Kim .................... F27D 99/0006
419/45
5,679,153 A 10/1997 Dmitriev et al.
(Continued)

FOREIGN PATENT DOCUMENTS

CN 104854678 A 8/2015
EP 1026290 A1 8/2000
(Continued)

OTHER PUBLICATIONS

European Patent Office, English computer translation of JP 2008-016691 (Year: 2024).*
(Continued)

*Primary Examiner* — Matthew J Song
(74) *Attorney, Agent, or Firm* — WHDA, LLP

(57) ABSTRACT

Disclosed is a method for using a SiC container (3) in which Si vapor and C vapor are generated in the internal space during the heat treatment. The SiC container may be heated in Si atmosphere to grow an epitaxial layer of single crystalline SiC on the underlying substrate housed in the internal space. The SiC container may be heated in a TaC container of a material including TaC supplemented with a source of Si to grow an epitaxial layer of single crystalline SiC on the underlying substrate housed in the internal space.

6 Claims, 10 Drawing Sheets

Related U.S. Application Data application No. 16/096,475, filed as application No. PCT/JP2017/016738 on Apr. 27, 2017, now Pat. No. 11,359,307.

(51) Int. Cl.
  *C30B 23/06* (2006.01)
  *H01L 21/02* (2006.01)

(52) U.S. Cl.
  CPC .. *H01L 21/02378* (2013.01); *H01L 21/02389* (2013.01); *H01L 21/02433* (2013.01); *H01L 21/02529* (2013.01); *H01L 21/02631* (2013.01)

(58) Field of Classification Search
  CPC ......... H01L 21/02378; H01L 21/02389; H01L 21/02433; H01L 21/02529; H01L 21/02631
  See application file for complete search history.

(56) References Cited

U.S. PATENT DOCUMENTS

| | | | |
|---|---|---|---|
| 5,989,340 A * | 11/1999 | Stephani | C30B 29/36 117/106 |
| 2007/0283880 A1 | 12/2007 | Tsvetkov et al. | |
| 2011/0278594 A1* | 11/2011 | Nishiguchi | H01L 29/66068 117/106 |
| 2012/0152166 A1 | 6/2012 | Tokuda et al. | |
| 2015/0255314 A1 | 9/2015 | Torimi et al. | |
| 2017/0204532 A1 | 7/2017 | Land | |
| 2017/0236905 A1 | 8/2017 | Torimi et al. | |
| 2022/0259760 A1 | 8/2022 | Kaneko et al. | |

FOREIGN PATENT DOCUMENTS

| | | | | |
|---|---|---|---|---|
| GB | 1458445 A | 12/1976 | | |
| JP | H11-87257 A | 3/1993 | | |
| JP | 10-509943 A | 9/1998 | | |
| JP | H10-509689 A | 9/1998 | | |
| JP | 11-315000 A | 11/1999 | | |
| JP | 2007-284298 A | 11/2007 | | |
| JP | 2008016691 A | * | 1/2008 | .......... H01L 21/324 |
| JP | 2009-7193 A | 1/2009 | | |
| JP | 2009-155140 A | 7/2009 | | |
| JP | 2010-64919 A | 3/2010 | | |
| JP | 2011-233780 A | 11/2011 | | |
| JP | 2013-189323 A | 9/2013 | | |

OTHER PUBLICATIONS

International Search Report dated Jun. 27, 2017, issued in counterpart International Application No. PCT/JP2017/016738 (1 page).
International Search Report dated Jun. 27, 2017, issued in counterpart application No. PCT/JP2017/016738. (1 pages).
European Patent Office, English computer translation of JPH11315000A (Year: 2020).
European Patent Office, English computer translation of JP2009007193A (Year: 2020).
Extended European Search Report dated Aug. 9, 2021, issued in European Application No. 21176448.5 (8 pages; in English).
Extended European Search Report dated Aug. 10, 2021, issued in European Application No. 21176449.3 (8 pages, in English).
Non-Final Office Action dated Nov. 25, 2022, issued in U.S. Appl. No. 17/734,511 (14 pages).
Office Action dated Mar. 24, 2023, issued in the counterpart to CN application No. 202111338480.9, with English Translation. (20 pages).
Final Office Action dated May 19, 2023, issued in U.S. Appl. No. 17/734,578 (15 pages).
Final Office Action dated Jun. 1, 2023, issued in U.S. Appl. No. 17/734,511 (10 pages).
Non-Final Office Action dated Sep. 13, 2023, issued in U.S. Appl. No. 17/734,511 (10 pages).
Non-Final Office Action dated Sep. 28, 2023, issued in U.S. Appl. No. 17/734,578 (11 pages).
Non-Final Office Action dated Nov. 10, 2022, issued in U.S. Appl. No. 17/734,578 (14 pages).
Non-Final Office Action dated Apr. 9, 2024, issued in U.S. Appl. No. 17/734,578 (11 pages).

* cited by examiner

Fig.3
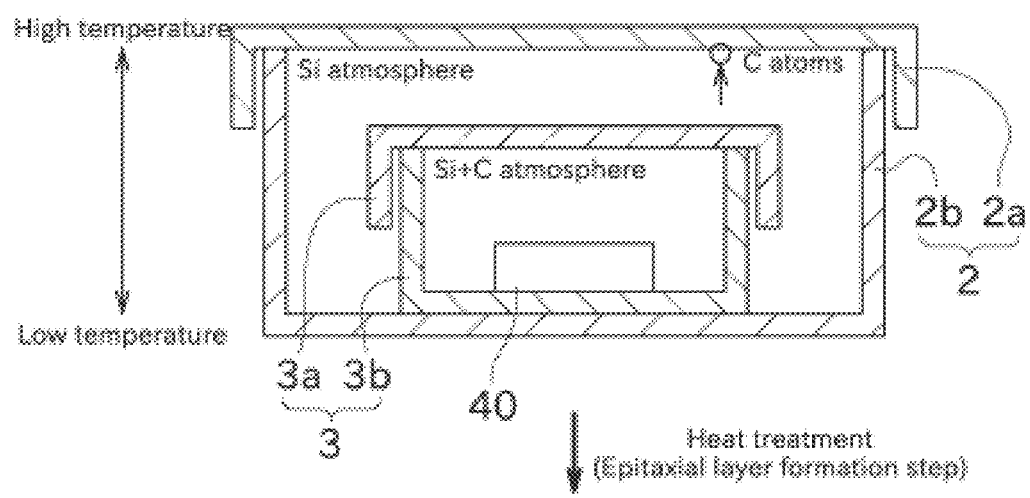
Heat treatment
(Epitaxial layer formation step)
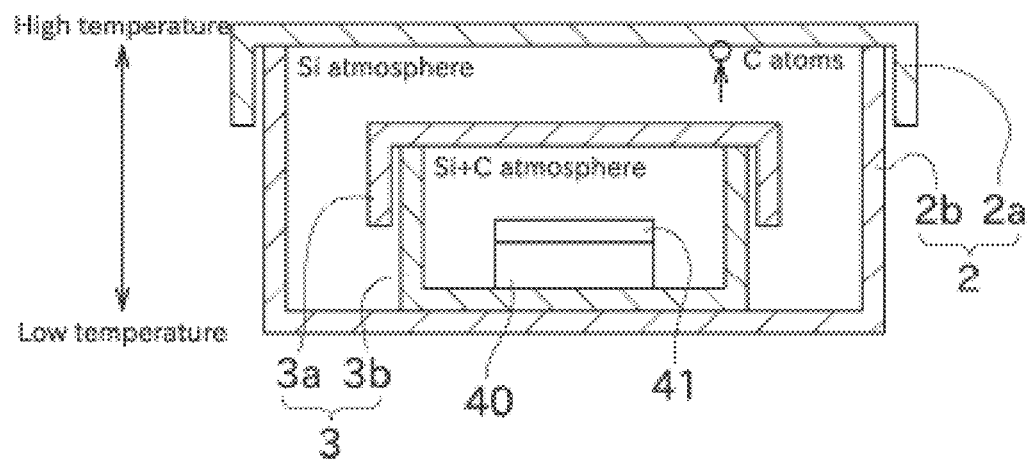

METHOD OF USING SIC CONTAINER

CROSS-REFERENCE OF RELATED APPLICATIONS

This application is a Divisional of application Ser. No. 17/734,511, filed May 2, 2022, which is a Divisional of application Ser. No. 16/096,475 which is patented as U.S. Pat. No. 11,359,307, filed Oct. 25, 2018, which is a 371 of International Application No. PCT/JP2017/016738, filed Apr. 27, 2017, which claims priority of Japanese Patent Application No. 2016-092073, filed Apr. 28, 2016, the entire contents of which are incorporated herein by reference.

TECHNICAL FIELD

The present invention mainly relates to a container made of SiC and a method for vapor-phase growth of an epitaxial layer of single crystalline SiC on an underlying substrate.

BACKGROUND ART

As a material for semiconductor wafers, silicon carbide (SiC) has attracted attention in recent years. SiC has high mechanical strength and high radiation resistance. In addition, SiC shows high valence controllability of electrons and holes by adding an impurity and has features in a wide forbidden band width (e.g., 2.2 eV in 3C-type single crystalline SiC), a high breakdown field, and a high saturated drift velocity of electrons. For such reasons, SiC has been hopefully expected as a material for next-generation power devices capable of achieving high temperature, high frequency, high withstand voltage, and high environmental resistance, which cannot be achieved by existing semiconductor materials. Furthermore, SiC has attracted attention as a substrate for a light-emitting diode (LED).

A technique for forming an epitaxial layer has been known in a method for producing a semiconductor wafer using SiC. Patent Literatures 1 and 2 (PTLs 1 and 2) disclose methods for forming SiC epitaxial layers.

PTL 1 describes that the SiC epitaxial layer is formed by chemical vapor deposition (CVD). In the process of causing the epitaxial layer to grow, a defect generation suppression layer whose growth velocity is reduced to 1 µm/h or less is introduced so that an epitaxial layer with a small amount of defects can be formed.

Another known technique for causing an epitaxial layer to grow is as follows. This method for forming an epitaxial layer includes the step of causing SiC bulk crystal to grow using a seed crystal addition and sublimation technique and the step of causing liquid-phase growth of an epitaxial layer on a bulk crystal surface. In the step of causing an epitaxial layer to glow, a liquid-phase growth is performed so that micropipe defects having propagated from the seed crystal to the bulk crystal substrate are closed, which achieves formation of a SiC epitaxial layer containing a small amount of micropipe defects.

CITATION LIST

Patent Literature

PTL1: Japanese Patent Application Laid-Open No. 2007-284298

SUMMARY OF INVENTION

Technical Problem

However, the CVD method of PTL 1 has a low growth velocity, and thus, the process period is long especially in a case of forming a relatively thick epitaxial layer. Thus, this method increases manufacturing costs, and therefore, is not suitable for mass production. In a case of employing the CVD method, the amount of supply of a source gas varies depending on the height and place, for example, of the substrate, and thus, the growth velocity can be nonuniform.

In the method using the seed crystal addition and sublimation technique described above, in the step of causing the epitaxial layer to grow, an element for increasing solubility of an melted material obtained by melting SiC is mixed in a silicon melt. Thus, this element might be unintentionally mixed in epitaxial crystal, and different polymorphs might also be mixed because of a high solvent (carbon) concentration in the silicon melt. As a result, a failure might occur in forming a high-purity epitaxial layer.

The present invention has been made in view of the circumstances described above, and a primary object of the present invention is to provide a method for forming a SiC epitaxial layer with high purity in a short time.

Solution to Problem and Advantageous Effects

Problems to be solved by the present invention are as described above. Solutions to the problems and advantageous effects thereof will now be described.

A first aspect of the present invention provides a vapor-phase epitaxial growth method as follows. Specifically, in a state in which a SiC container of a material including polycrystalline SiC is housed in a TaC container of a material including TaC and in which an underlying substrate is housed in the SiC container, the TaC container is heated with a temperature gradient such that inside of the TaC container is at a Si vapor pressure. Consequently, C atoms sublimated by etching of the inner surface of the SiC container are bonded to Si atoms in an atmosphere, thereby performing an epitaxial layer growth step of causing an epitaxial layer of single crystalline SiC to grow on the underlying substrate.

In addition, since SiC has high heat resistance, the process temperature in heating can be increased to about 2000° C., and thus, a high-purity SiC epitaxial layer can be formed in a short time. Furthermore, since a material for the epitaxial layer is the SiC container, the epitaxial layer can be caused to grow uniformly, as compared to, for example, CVD in which a source gas is introduced.

In the vapor-phase epitaxial growth method, a material for the underlying substrate is preferably an Al compound or a N compound.

Accordingly, with the method of an aspect of the present invention, the underlying substrate is not limited to SiC, and thus, a versatile epitaxial growth method can be obtained.

In the vapor-phase epitaxial growth method, a material for the underlying substrate may be SiC, and an off-angle to a <11-20> direction or a <1-100> direction may be 1° or less.

As a result, in a case where the underlying substrate is SiC and the off-angle is small, a terrace expands, and a high-quality epitaxial layer of SiC can be easily formed independently of crystalline polymorphism of the underlying substrate.

In the vapor-phase epitaxial growth method, in the epitaxial layer growth step, the temperature gradient is preferably 2° C./mm or less.

Thus, with the method of an aspect of the present invention, the pressure of C atoms in the SiC container increases, and thus, an epitaxial layer is allowed to grow sufficiently even with a small temperature gradient as described above. As a result, the heater and heating control can be simplified.

In the vapor-phase epitaxial growth method, in the epitaxial layer growth step, the underlying substrate preferably includes a plurality of underlying substrates placed in the SiC container so that the epitaxial layer is formed on each of the plurality of underlying substrates.

Accordingly, the epitaxial layers can be formed at the same time on the plurality of underlying substrates, and thus, the process can be performed efficiently. In particular, the use of the method of the aspect of the present invention enables the epitaxial layer to be uniformly formed independently of the position in the SiC container, and thus, quality does not degrade.

Preferably, in the vapor-phase epitaxial growth method, an inner surface of the TaC container is preferably Si or a Si compound and heating in growth of the epitaxial layer sublimates Si atoms from the inner surface of the TaC container so that inside of the TaC container is at a Si vapor pressure.

Accordingly, a labor of an operator can be alleviated, as compared to a method of placing solid Si or the like in the TaC container. In addition, by forming Si or the like over a wide range of the inner surface of TaC, a uniform Si atmosphere can be obtained.

In the vapor-phase epitaxial growth method, crystalline polymorphism of the epitaxial layer is preferably 3C—SiC.

Alternatively, in the vapor-phase epitaxial growth method, crystalline polymorphism of the epitaxial layer may be 4H—SiC or 6H—SiC.

Accordingly, epitaxial layers of various types of crystalline polymorphism are allowed to grow with advantages of some aspects of the present invention.

A second aspect of the present invention provides a method for producing a substrate with an epitaxial layer using the vapor-phase epitaxial growth method described above.

With this method, a substrate with a high-purity epitaxial layer can be efficiently produced.

The method for producing a substrate with an epitaxial layer is preferably as follows. The underlying substrate is made of SiC. The underlying substrate is housed in the TaC container without interposition of a SiC container and is heated under a Si vapor pressure, thereby etching the underlying substrate.

In this manner, the TaC container can be used not only for forming the epitaxial layer but also for etching.

BRIEF DESCRIPTION OF DRAWINGS

FIG. 3 Cross-sectional schematic views illustrating a process of causing an epitaxial layer to grow using a TaC container and a SiC container.

DESCRIPTION OF EMBODIMENT

Hereinafter, an embodiment of the present invention will be described with reference to the drawings.

Figure 1:
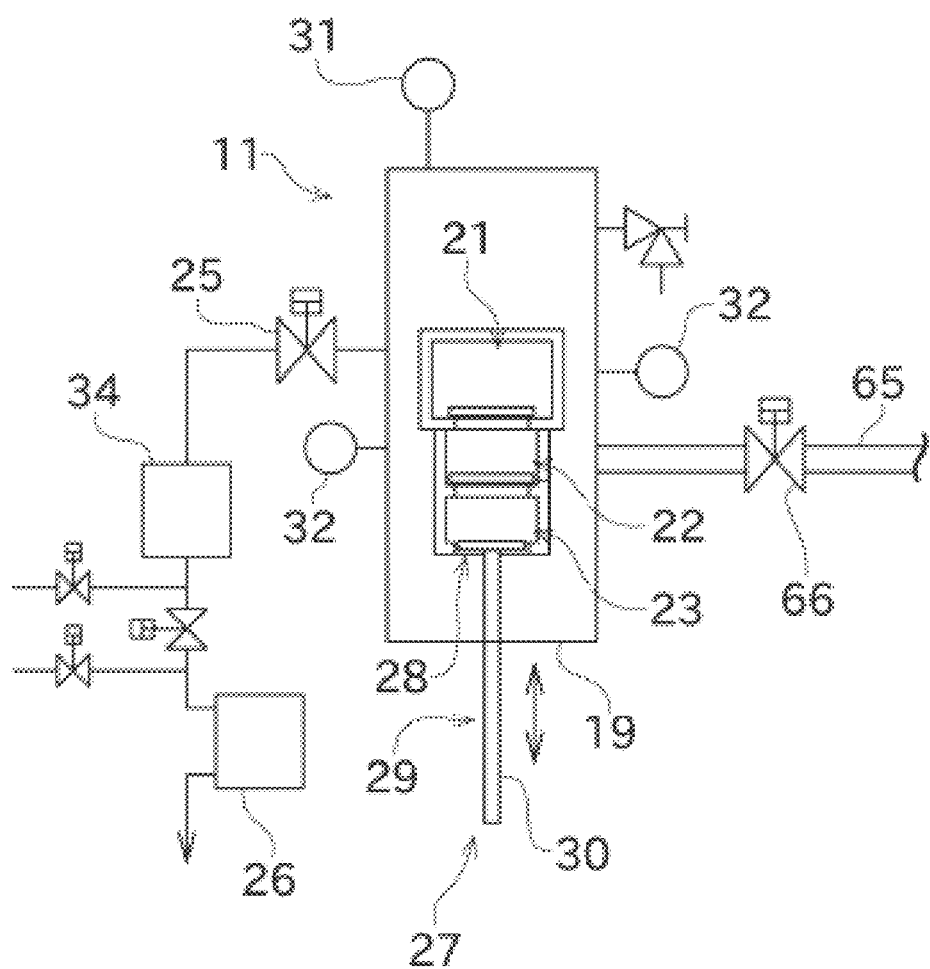
FIG. 1 A schematic view illustrating a high-temperature vacuum furnace for use in a heat treatment.
Figure 2:
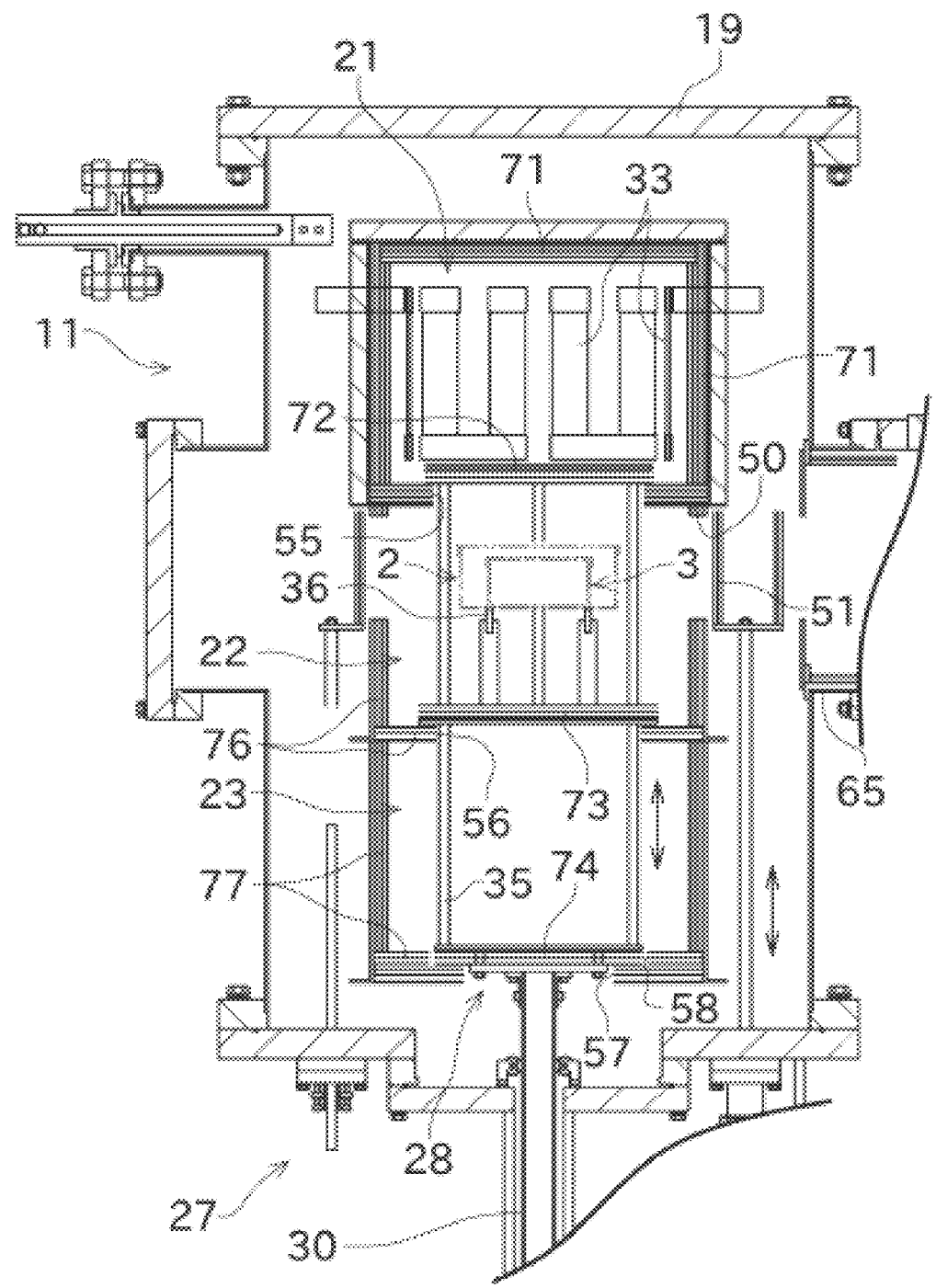
FIG. 2 A cross-sectional structural drawing illustrating a main heating chamber and a preheating chamber of the high-temperature vacuum furnace in detail.

First, referring to FIGS. 1 through 3, a high-temperature vacuum furnace 11, a TaC container 2, and a SiC container 3 for performing a heat treatment will be described. FIG. 1 is a schematic view illustrating the high-temperature vacuum furnace 11 for use in a heat treatment. FIG. 2 is a cross-sectional view illustrating a main heating chamber and a preheating chamber of the high-temperature vacuum furnace 11 in detail. FIG. 3 is cross-sectional schematic views illustrating a process of causing an epitaxial layer to grow using the TaC container 2 and the SiC container 3.

As illustrated in FIGS. 1 and 2, the high-temperature vacuum furnace 11 includes a main heating chamber 21 capable of heating an object (e.g., an underlying substrate) to temperatures of 1000° C. or more and 2300° C. or less and a preheating chamber 22 capable of preheating the object to temperatures of 500° C. or more. The preheating chamber 22 is disposed below the main heating chamber 21, and adjacent to the main heating chamber 21 vertically (in top-bottom directions). The high-temperature vacuum furnace 11 includes a heat insulating chamber 23 disposed below the preheating chamber 22. The heat insulating chamber 23 is vertically adjacent to the preheating chamber 22.

The high-temperature vacuum furnace 11 includes a vacuum chamber 19. The main heating chamber 21 and the preheating chamber 22 are disposed inside the vacuum chamber 19. The vacuum chamber 19 is connected to a turbo-molecular pump 34 serving as a vacuum generator, and a vacuum of $10^{-2}$ Pa or less and preferably $10^{-7}$ Pa or less, for example, can be obtained in the vacuum chamber 19. A gate valve 25 is disposed between the turbo-molecular pump 34 and the vacuum chamber 19. The turbo-molecular pump 34 is connected to an auxiliary rotary pump 26.

The high-temperature vacuum furnace 11 includes a movement mechanism 27 capable of moving the object vertically between the preheating chamber 22 and the main heating chamber 21. The movement mechanism 27 includes a support 28 capable of supporting the object and a cylinder 29 capable of moving the support 28 vertically. The cylinder 29 includes a cylinder rod 30, and one end of the cylinder rod 30 is coupled to the support 28. The high-temperature vacuum furnace 11 is provided with a vacuum gauge 31 for measuring the degree of vacuum and a mass spectrometer 32 for mass spectrometry.

The vacuum chamber 19 is connected to an unillustrated stock room for storing the object through a transport path 65. The transport path 65 can be opened and closed by a gate valve 66.

The main heating chamber 21 has a regular hexagon shape in cross-sectional plan view, and is disposed in an upper portion of the internal space of the vacuum chamber 19. As illustrated in FIG. 2, the main heating chamber 21 incorporates a mesh meter 33 as a heater. A first multilayer heat reflection metal plate 71 is fixed to a side wall and a ceiling of the main heating chamber 21, and is configured to reflect heat of the mesh meter 33 toward the center of the main heating chamber 21.

In this manner, a layout is made in the main heating chamber 21, in which the mesh heater 33 is disposed to surround the object as a heat treatment object, and the multilayer heat reflection metal plate 71 is disposed outside the mesh meter 33. The mesh meter 33 is configured to have its width increase toward the top, for example, or is configured such that electric power to be supplied increases toward the top. Accordingly, a temperature gradient can be provided in the main heating chamber 21. The temperature of the main heating chamber 21 can be increased to temperatures of 1000° C. or more and 2300° C. or less, for example.

The ceiling of the main heating chamber 21 is closed by the first multilayer heat reflection metal plate 71, whereas a through hole 55 is formed in the first multilayer heat reflection metal plate 71 at the bottom. The object can move through the through hole 55 between the main heating chamber 21 and the preheating chamber 22 adjacent to the bottom of the main heating chamber 21.

A part of the support 28 of the movement mechanism 27 is inserted in the through hole 55. The support 28 has a configuration in which a second multilayer heat reflection metal plate 72, a third multilayer heat reflection metal plate 73, and a fourth multilayer heat reflection metal plate 74 are arranged in this order from the top with intervals.

The three multilayer heat reflection metal plates 72 through 74 are each oriented horizontally and are coupled to one another by a column 35 oriented vertically. A receiver 36 is disposed in space sandwiched between the second multilayer heat reflection metal plate 72 and the third multilayer heat reflection metal plate 73 so that the TaC container 2 housing the object can be placed on the receiver 36. In this embodiment, the receiver 36 is made of tantalum carbide.

An end of the cylinder rod 30 of the cylinder 29 has a flange that is fixed to a lower surface of the fourth multilayer heat reflection metal plate 74. With this configuration, when the cylinder 29 is caused to extend and contract, the object on the receiver 36 can be moved upward and downward together with the three multilayer heat reflection metal plates 72 through 74.

The preheating chamber 22 is formed by surrounding space below the main heating chamber 21 by multilayer heat reflection metal plates 76. The preheating chamber 22 is configured to have a circular shape in cross-sectional plan view. The preheating chamber 22 does not include a heater such as the mesh meter 33.

As illustrated in FIG. 2, a through hole 56 is formed in the multilayer heat reflection metal plate 76 at the bottom of the preheating chamber 22. A passage hole 50 is formed in a portion of the multilayer heat reflection metal plate 76 constituting a side wall of the preheating chamber 22, the portion facing the transport path 65. The high-temperature vacuum furnace 11 also includes an opening/closing member 51 that can close the passage hole 50.

The heat insulating chamber 23 disposed adjacent to the bottom of the preheating chamber 22 is defined by the multilayer heat reflection metal plate 76 at the top and by multilayer heat reflection metal plates 77 at the side. A through hole 57 is formed in the multilayer heat reflection metal plate 77 covering the bottom of the heat insulating chamber 23 so that the cylinder rod 30 can be inserted therethrough.

The multilayer heat reflection metal plate 77 has a housing recess 58 at a position corresponding to the upper end of the through hole 57. The housing recess 58 can accommodate the fourth multilayer heat reflection metal plate 74 of the support 28.

Each of the multilayer heat reflection metal plates 71 through 74, 76, and 77 has a structure in which metal plates (made of tungsten) are stacked with predetermined intervals. In the opening/closing member 51, a multilayer heat reflection metal plate having a similar structure is used for a portion closing the passage hole 50.

As a material for the multilayer heat reflection metal plates 71 through 74, 76, and 77, any material may be used as long as the material has sufficient heating properties to thermal radiation of the mesh meter 33 and has a melting point higher than an ambient temperature. Instead of tungsten used above, a high-melting-point metal material such as tantalum, niobium, or molybdenum may be used for the multilayer heat reflection metal plates 71 through 74, 76, and 77. Carbides such as tungsten carbide, zirconium carbide, tantalum carbide, hafnium carbide, and molybdenum carbide may be used as the multilayer heat reflection metal plates 71 through 74, 76, and 77. Reflection surfaces of the multilayer heat reflection metal plates 71 through 74, 76, and 77 may be further provided with an infrared reflection film of, for example, gold or tungsten carbide.

Each of the multilayer heat reflection metal plates 72 through 74 of the support 28 has a structure in which perforated-metal tungsten plates each having a large number of small through holes are stacked with predetermined intervals with the through holes displaced from one another.

The number of stacked layers of the second multilayer heat reflection metal plate 72 at the uppermost layer of the support 28 is smaller than that of the first multilayer heat reflection metal plate 71 of the main heating chamber 21.

In this state, the object is introduced from the transport path 65 into the vacuum chamber 19 and is placed on the receiver 36 in the preheating chamber 22. When the mesh meter 33 is then driven in this state, the main heating chamber 21 is heated to a predetermined temperature of 1000° C. or more and 2300° C. or less (e.g., about 1900° C.). At this time, the driving of the turbo-molecular pump 34 adjusts the pressure in the vacuum chamber 19 to $10^{-3}$ Pa or less and preferably $10^{-5}$ Pa or less.

Here, as described above, the number of stacked layers of the second multilayer heat reflection metal plate 72 of the support 28 is smaller than that of the first multilayer heat reflection metal plate 71. Thus, a part of heat generated by the mesh meter 33 is appropriately supplied (distributed) to the preheating chamber 22 through the second multilayer heat reflection metal plate 72 so that the object in the preheating chamber 22 can be preheated to a predetermined temperature of 500° C. or more (e.g., 800° C.). That is, preheating can be achieved without a heater in the preheating chamber 22, and the configuration of the preheating chamber 22 can be simplified.

The preheat treatment described above is performed in a predetermined time, and then, the cylinder 29 is driven to lift the support 28. Consequently, the object passes through the through hole 55 from below and moves into the main heating chamber 21. As a result, a main heat treatment starts immediately, and the temperature of the object in the main heating chamber 21 can be rapidly increased to a predetermined temperature (about 1900° C.).

As illustrated in FIG. 3, the TaC container 2 is a fitted container including an upper container 2a and a lower container 2b that can be fitted to each other. With this configuration, although the internal space of the TaC container 2 is sealed, a small amount of gas atoms can move from the inside of the TaC container 2 to the outside (or in the opposite direction). In addition, the TaC container 2 is configured to exert C-atom adsorption ion pump function described later in the case of performing a high-temperature treatment under vacuum. Specifically, the TaC container 2 is made of a tantalum metal and is configured to expose a tantalum carbide layer in the internal space.

More specifically, the TaC container 2 is configured such that a TaC layer is formed as the innermost layer (layer closest to the object), a $Ta_2C$ layer is formed outside the TaC layer, and a tantalum metal as a base material is formed outside the $Ta_2C$ layer. Thus, as long as the high-temperature treatment continues under vacuum as described above, the TaC container 2 shows the function of continuously adsorbing carbon atoms from a surface of the tantalum carbide layer and taking the carbon atoms therein. In this regard, the TaC container 2 of this embodiment has the C-atom adsorption ion pump function (ion getter function). The innermost TaC layer is supplemented with Si. Accordingly, in the heat treatment, Si supplemented to this TaC layer is sublimated, and Si vapor is generated. In Si vapor and C vapor contained in the atmosphere in the TaC container 2, only the C vapor is selectively occluded in the TaC container 2, and thus, the atmosphere in the TaC container 2 can be maintained as a high-purity Si atmosphere.

A source of Si is not limited to the structure that supplies Si to an inner wall of the TaC container 2, and the inner wall of the TaC container 2 may be made of $Ta_xSi_y$ (e.g., $TaSi_2$ or $Ta_5Si_3$) or other Si compounds, for example. Alternatively, solid Si (Si pellet) may be disposed in the TaC container 2.

The SiC container 3 is configured to include polycrystalline SiC such as 3C—SiC. In this embodiment, the entire SiC container 3 is constituted by SiC. A part (e.g., inner surface) of the SiC container 3 may be made of polycrystalline SiC as long as Si vapor and C vapor are generated in the internal space during the heat treatment.

The SiC container 3 is a fitted container including an upper container 3a and a lower container 3b that can be fitted to each other, in the same manner as the TaC container 2. With this configuration, although the internal space of the SiC container 3 is sealed, a small amount of gas atoms can move from the inside of the SiC container 3 to the outside (or in the opposite direction). Accordingly, Si vapor generated in the TaC container 2 moves from the outside of the SiC container 3 to the inside of the SiC container 3 so that Si vapor can be supplied to the internal space of the SiC container 3. As illustrated in FIG. 3, since the SiC container 3 is placed in the TaC container 2, the SiC container 3 is smaller in size than the TaC container 2. The SiC container 3 houses at least one underlying substrate 40.

Figure 5:
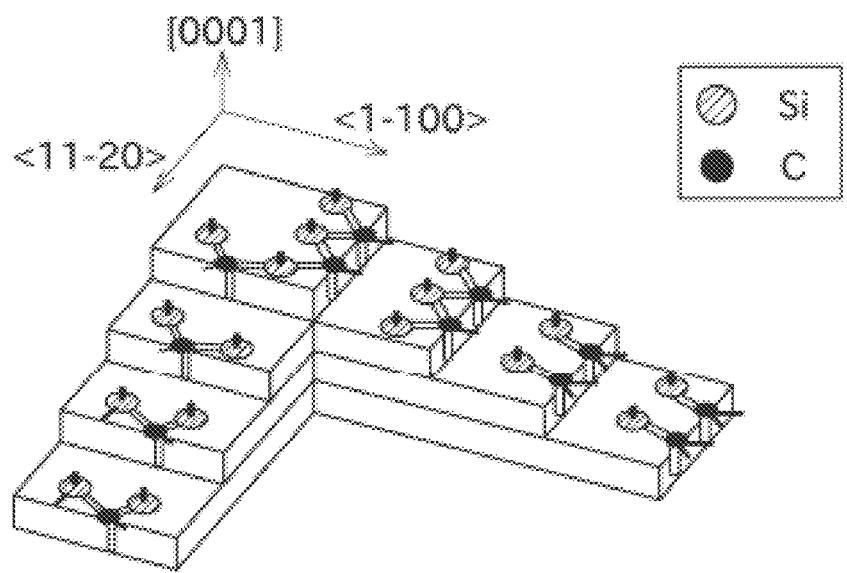
FIG. 5 A view illustrating an off-angle of a SiC substrate.

The underlying substrate 40 is a substrate serving as a base or an underlying layer for forming an epitaxial layer 41. The underlying substrate 40 may be a SiC substrate or may be a substrate of a material except SiC (e.g., an Al compound or a N compound). In the case of the SiC substrate, crystalline polymorphism is optional, and may be 3C—SiC, 4H—SiC, or 6H—SiC, for example. In a case where the underlying substrate 40 is a SiC substrate, the off-angle (see FIG. 5) relative to the <11-20> direction or the <1-100> direction may be 1° or less or larger than 1°. The epitaxial layer 41 may be formed on any one of the Si surface and the C surface of the underlying substrate 40.

Next, an epitaxial growth step will be described. In this embodiment, the epitaxial layer 41 of single crystalline 3C—SiC is formed on the underlying substrate 40 by a vapor-phase epitaxial growth method. Specifically, as illustrated in FIG. 3, the underlying substrate 40 is housed in the SiC container 3, and the SiC container 3 is further housed in the TaC container 2. A temperature gradient is provided in such a manner that the temperature in an upper portion of the TaC container 2 (where the epitaxial layer 41 is formed) is high. The temperature gradient is preferably 2° C./mm or less, and more preferably about 1° C./mm. In this state, the TaC container 2 is heated at a temperature of 1600° C. or more and 2300° C. or less.

With this heat treatment, Si supplied to the inner surface of the TaC container 2 is sublimated, and the inside of the TaC container 2 has an equilibrium vapor pressure of Si. In the case of using another Si source, sublimation of Si makes the inside of the TaC container 2 at an equilibrium vapor pressure of Si. Accordingly, the SiC container 3 is heated at high temperatures under a Si vapor pressure, and thus, the SiC container 3 is subjected to etching (Si vapor pressure etching). Specifically, the following reaction is performed. To put it briefly, by heating SiC under a Si vapor pressure, SiC is sublimated as $Si_2C$ or $SiC_2$, for example, through thermal decomposition and chemical reaction with Si. In the SiC container 3, a high C partial pressure is generated, and the C component is transferred to the surface of the underlying substrate 40 using a temperature gradient of 2° C./mm or less as a driving force, and 3C—SiC is crystallized.

The SiC container 3 is subjected to Si vapor pressure etching so that carbonization of the SiC container 3 can be prevented and C atoms (or the C compound) can be sublimated from the SiC container 3. Here, since the TaC container 2 has the C-atom adsorption ion pump function as described above, the space inside the TaC container 2 and outside the SiC container 3 has a high-purity Si atmosphere. On the other hand, C atoms are not absorbed in the inside of the SiC container 3, and thus, the inside of the SiC container 3 has a C atmosphere. In addition, Si vapor generated from the Si source of the TaC container 2 also enters the inside of the SiC container 3 through a gap between the upper container 3a and the lower container 3b of the SiC container 3. Accordingly, the inside of the SiC container 3 has a Si+C atmosphere. Thus, by performing the heat treatment with a temperature gradient, the epitaxial layer 41 of single crystalline 3C—SiC can be formed on the surface of the underlying substrate 40 (epitaxial layer growth step). In this manner, a substrate with the epitaxial layer can be produced.

Figure 4:
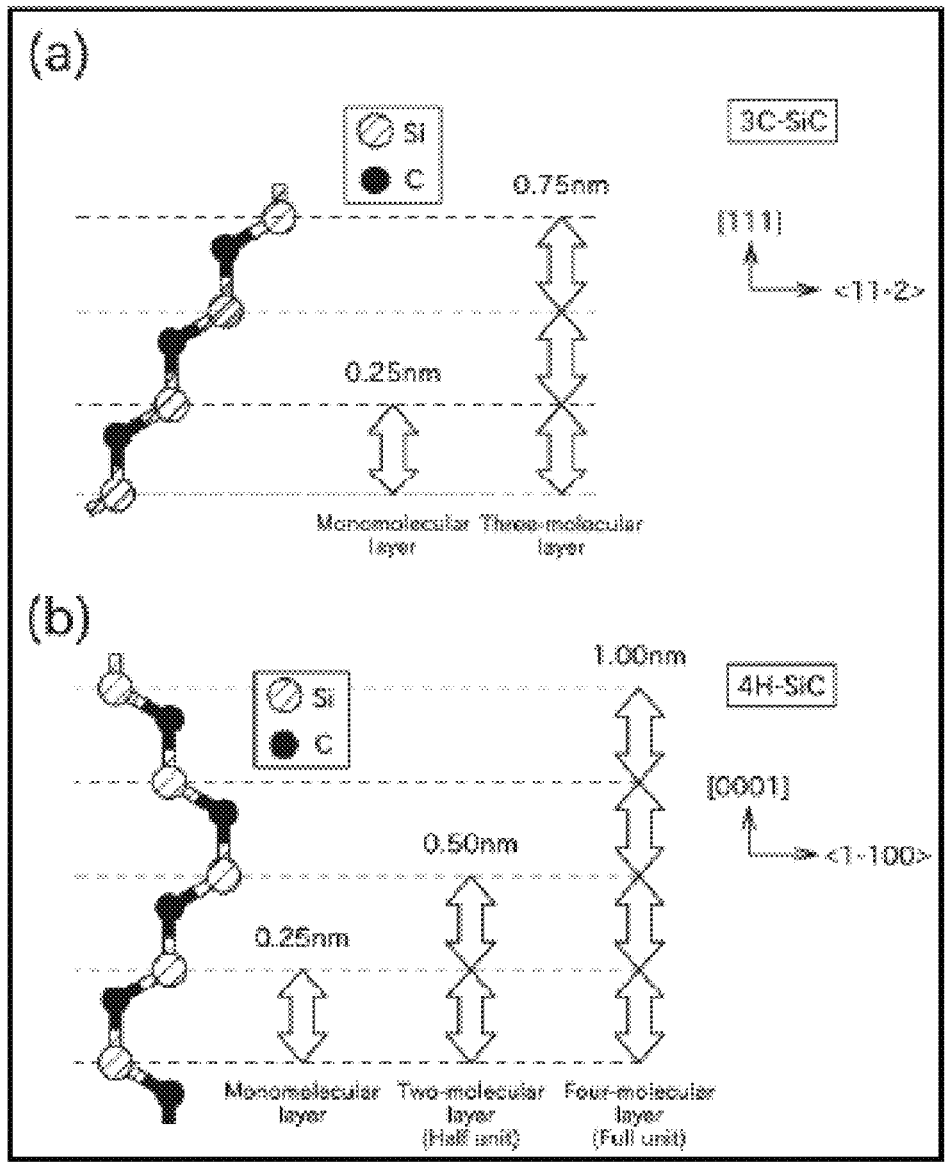
FIG. 4 Cross-sectional schematic views for describing atomic arrangements and stacking periods of 3C—SiC single crystal and 4H—SiC single crystal.

With reference to FIG. 4, molecular sequences of 4H—SiC and 3C—SiC will be briefly described. As illustrated in FIG. 4(a), 3C—SiC is configured such that Si atoms and C atoms are stacked, and a monomolecular layer of Si and C has a height of 0.25 nm. In 4H—SiC, the direction of sequence is reversed at every two molecular layers as illustrated FIG. 4(b), whereas in 3C—SiC, the direction of sequence is not reversed and is uniform.

Here, the underlying substrate 40 is covered with the TaC container 2 and the SiC container 3 as described above so that the partial pressure of C vapor in the SiC container 3 can be increased. Thus, even with a temperature gradient of about 1° C./mm, the epitaxial layer 41 is allowed to grow sufficiently. In a known sublimation technique or other techniques, a wider range of temperature gradient is necessary for obtaining an effective growth velocity. To increase the range of temperature gradient, however, a precise heater and fine control are needed, which leads to an increase in manufacturing costs. In view of this, this embodiment only requires that the temperature gradient be 2° C./mm or less, about 1° C./mm, or 1° C./mm or less, and thus, manufacturing costs can be reduced.

By causing the epitaxial layer 41 to grow with the technique of this embodiment, the epitaxial layer 41 of single crystalline 3C—SiC can be formed even using an underlying substrate 40 of a material except SiC. The epitaxial layer 41 of single crystalline 3C—SiC can also be formed using an underlying substrate 40 of a material except 3C—SiC. In addition, SiC can grow on 4H—SiC using an MBE (molecular beam epitaxy) technique and a CVD (chemical vapor deposition) technique. The MBE technique and the CVD technique, however, are not suitable for a heat treatment at 1600° C. or more, for example, and thus, the growth velocity has an upper limit. On the other hand, a sublimation proximity method is expected to have a high growth temperature and a high growth velocity, but has poor uniformity in a substrate surface. On the other hand, the method of this embodiment is suitable for a heat treatment at high temperatures of 1600° C. or more, and epitaxial growth of SiC is performed in a semi-closed system of the Poly-SiC container, and thus, has high uniformity.

In a case where the off-angle of the SiC substrate is large (e.g., larger than 1°), step flow growth occurs so that crystalline polymorphism of the underlying substrate 40 can be easily propagated. Thus, 4H—SiC as the epitaxial layer 41 grows on 4H—SiC as the underlying substrate 40. Thus, in a case where the epitaxial layer 41 of the 3C—SiC is needed, the off-angle of the SiC substrate is preferably small (e.g., 1° or less).

Figure 6:
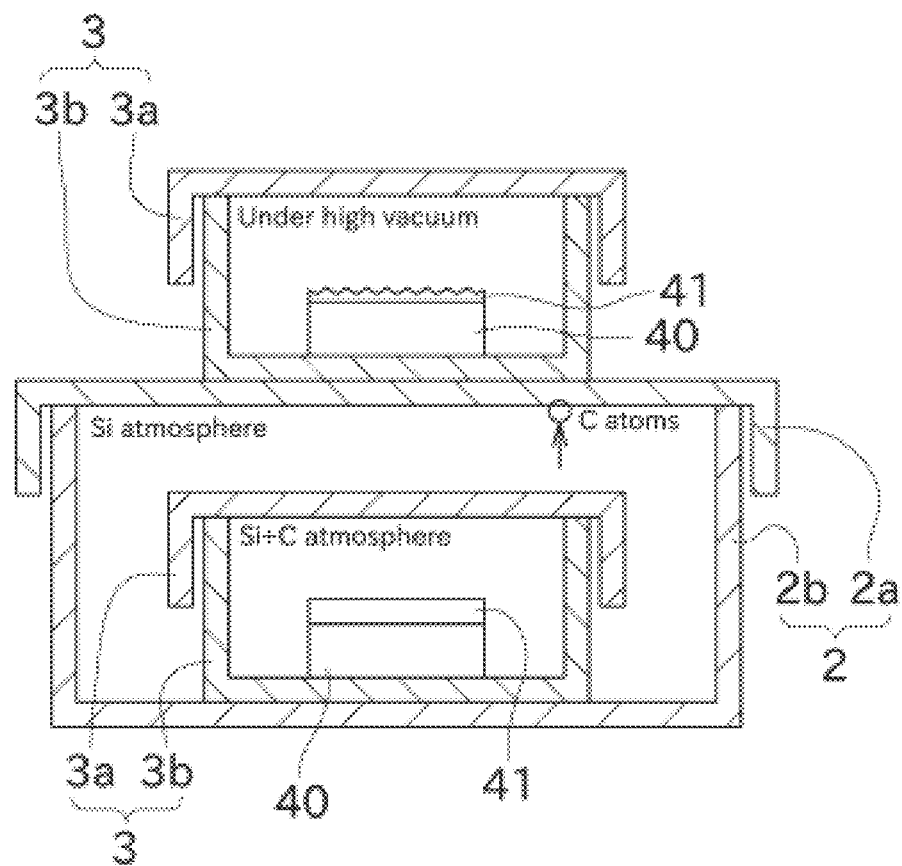
FIG. 6 A view illustrating a state in which an epitaxial layer grows with SiC containers disposed inside and outside of a TaC container.

Next, an experiment for determining advantages in housing the SiC container 3 in the TaC container 2 will be described with reference to FIGS. 6 and 7. As illustrated in FIG. 6, in this experiment, the SiC containers 3 were placed inside and outside the TaC container 2, and the epitaxial layer 41 was caused to grow on the underlying substrate 40 in each SiC container 3.

Figure 7:
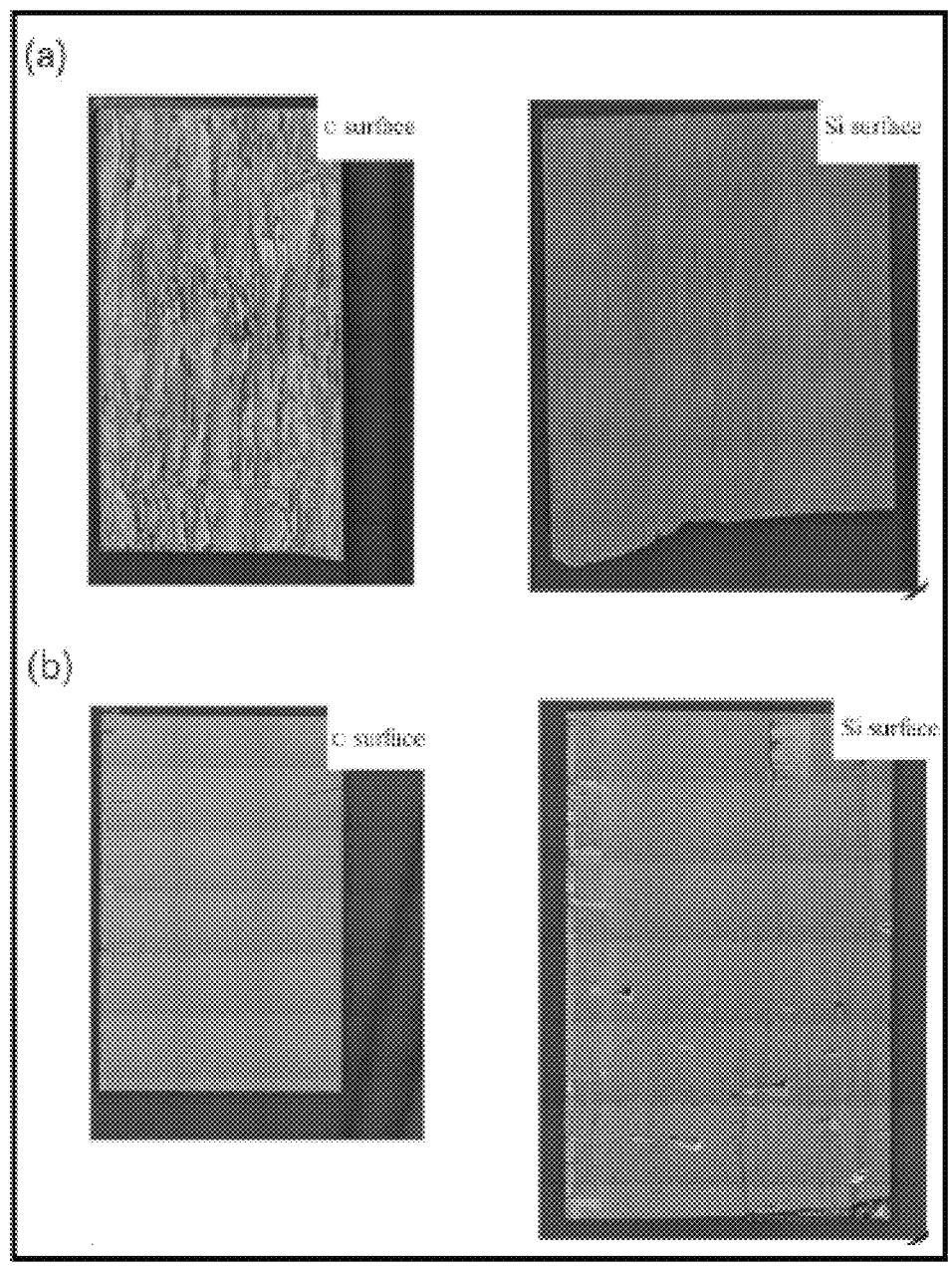
FIG. 7 Micrographs showing a Si surface and a C surface of an epitaxial layer that has grown with SiC containers disposed inside and outside of a TaC container.

FIG. 7 shows results of this experiment. FIG. 7(a) is a micrograph of the Si surface and the C surface of the epitaxial layer 41 in the case of epitaxial growth performed by placing the SiC container 3 outside the TaC container 2. FIG. 7(b) is a micrograph of the Si surface and the C surface of the epitaxial layer 41 in the case of epitaxial growth performed by placing the SiC container 3 inside the TaC container 2. By disposing the SiC container 3 inside the TaC container 2 in this manner, the surface of the epitaxial layer 41 is planalized, thereby forming a high-quality epitaxial layer 41. The growth velocity also increases about five times in the case of disposing the SiC container 3 inside the TaC container 2. By covering the underlying substrate 40 with the SiC container 3 and the TaC container 2 in the manner described above, the high-quality epitaxial layer 41 can be formed at high speed.

Figure 8:
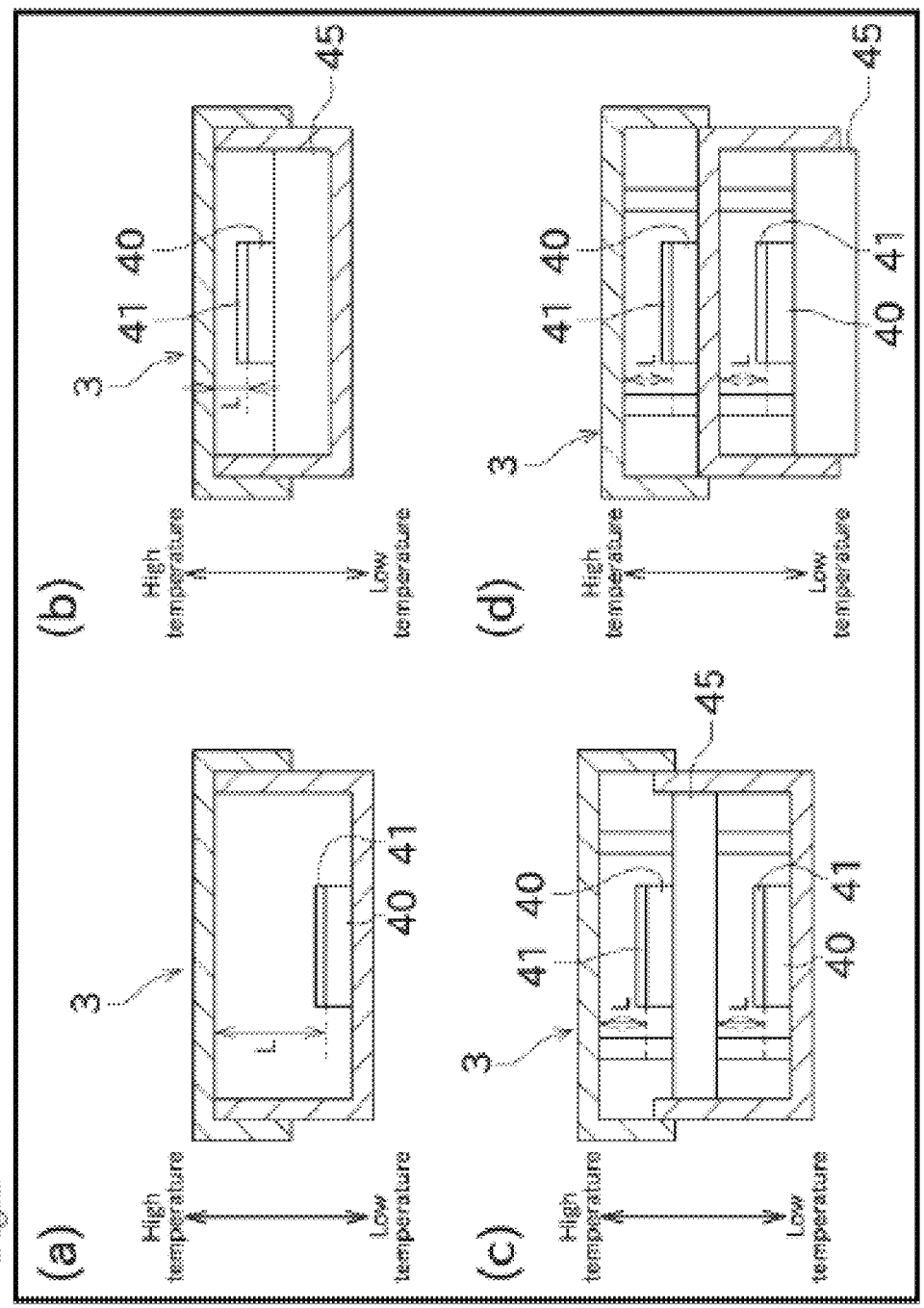
FIG. 8 Cross-sectional schematic views illustrating four patterns of heat treatment with different treatment conditions (especially a distance from an underlying substrate to a material).

Thereafter, an experiment for confirming uniform formation of the epitaxial layer 41 irrespective of the position in the SiC container 3 will be described with reference to FIGS. 8 and 9. As illustrated in FIG. 8, in this experiment, the underlying substrate 40 was placed in various environments, and heated at 1800° C. with a temperature gradient of about 1° C./mm to compare the amount of growth of the epitaxial layer 41. In particular, the experiment was conducted with variations of a distance L from the surface of the underlying substrate to the material (the SiC container 3 or a polycrystalline SiC plate 45). In FIGS. 8(a) and 8(b), one underlying substrate 40 is housed in one SiC container 3, whereas in FIGS. 8(c) and 8(d), two underlying substrates 40 are housed in one SiC container 3. Although FIG. 8 does not show the TaC container 2, each SiC container 3 is housed in the TaC container 2.

Figure 9:
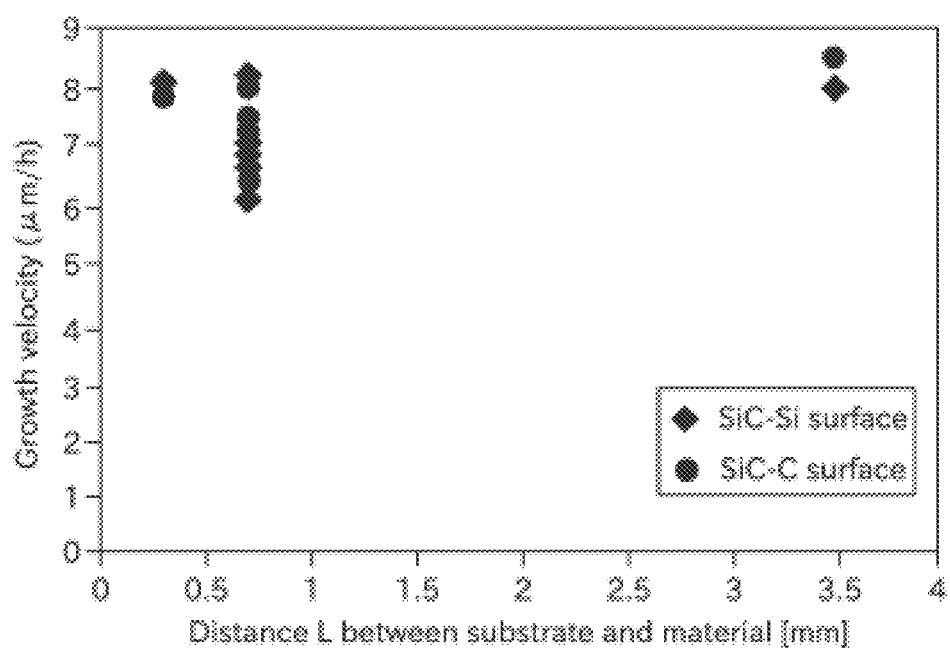
FIG. 9 A graph showing a relationship between the position of an underlying substrate and a growth velocity.

FIG. 9 shows results of this experiment. FIG. 9 is a graph showing a correspondence between a distance L from the surface of the underlying substrate 40 to a material and a growth velocity of the epitaxial layer 41 formed on the underlying substrate 40 in each of the underlying substrates 40 used in FIGS. 8(a) through 8(d). As shown in FIG. 9, all the underlying substrates 40 have substantially the same growth velocity. Thus, it was confirmed that if the temperature gradient is uniform, the epitaxial layer 41 is uniformly formed independently of the position in the SiC container 3. As illustrated in FIGS. 8(c) and 8(d), by housing the plurality of underlying substrates 40 in one SiC container 3, the epitaxial layer 41 can be efficiently formed.

As illustrated in FIG. 9, the growth velocity of the epitaxial layer 41 is 6 to 8 μm/h at 1800° C., which is six to eight times as high as that in the CVD method of PTL 1. In the method of this embodiment, the heating temperature can be 1800° C. or more, and thus, a higher growth velocity can be achieved. The temperature gradient may be further increased to be higher than 1° C./mm. This can achieve a higher growth velocity.

Figure 10:
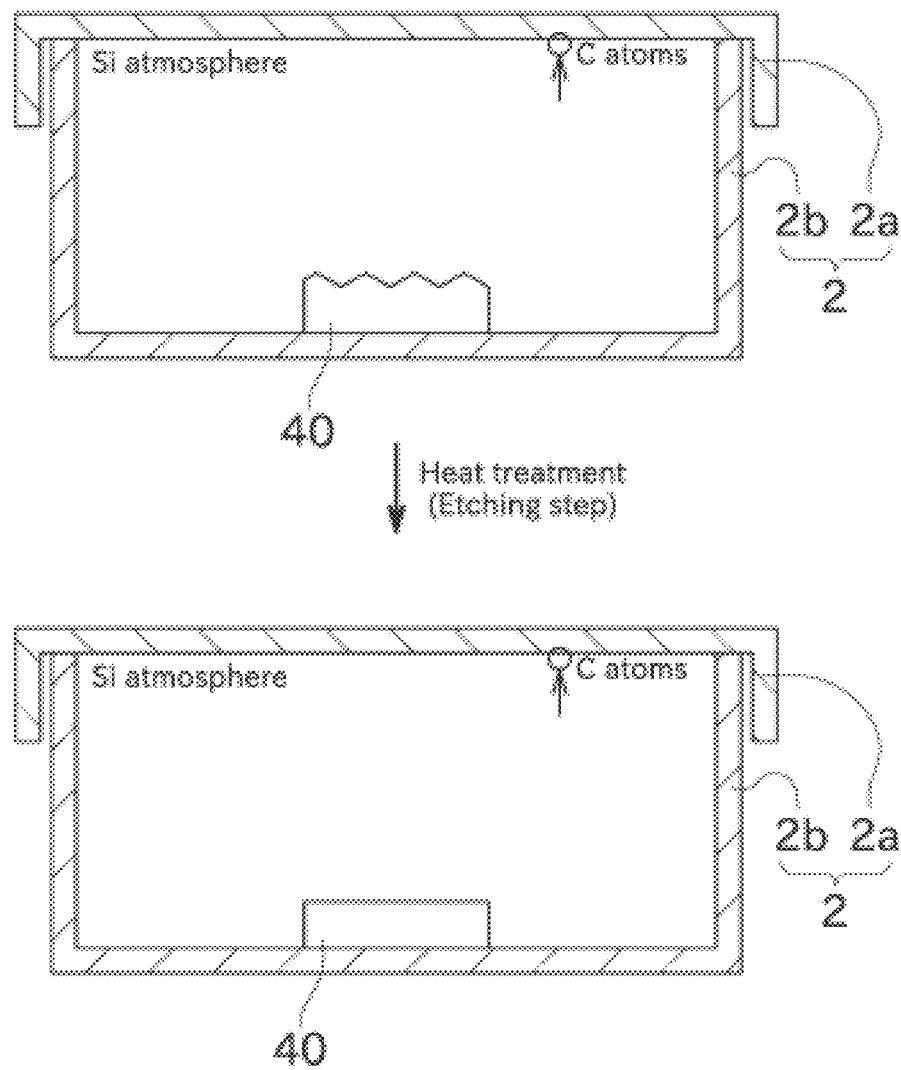
FIG. 10 Cross-sectional schematic views illustrating a process of performing etching using TaC.

The TaC container 2 of this embodiment can be used not only for the process of forming the epitaxial layer 41 but also for the process of etching the underlying substrate 40 (SiC substrate). As described above, since the inside of the TaC container 2 can be maintained in a high-purity Si atmosphere, as illustrated in FIG. 10, a SiC substrate directly (without interposition of the SiC container 3) disposed in the TaC container 2 can be etched by heating at 1600° C. or more (the Si vapor pressure etching).

The etching step may be performed at any time, and may be performed in order to planarize a SiC substrate after being cut out from an ingot and subjected to mechanical polishing (i.e., before formation of the epitaxial layer 41) or in order to planarize the epitaxial layer 41 roughened by injection of ions (impurity) (i.e., after formation of the epitaxial layer 41), for example.

In the above-described process, vapor-phase epitaxial growth is performed with the SiC container 3 housed in the TaC container 2 and the underlying substrate 40 housed in the SiC container 3 so that single crystalline 3C—SiC is caused to grow as the epitaxial layer 41 on the underlying substrate 40. With a similar process, single crystal 4H—SiC or single crystal 6H—SiC, for example, can be caused to grow as an epitaxial layer 41 on the underlying substrate 40. Crystalline polymorphism of the epitaxial layer 41 to grow can be selected by changing the off-angle and the temperature, for example, of the underlying substrate 40.

Figure 11:
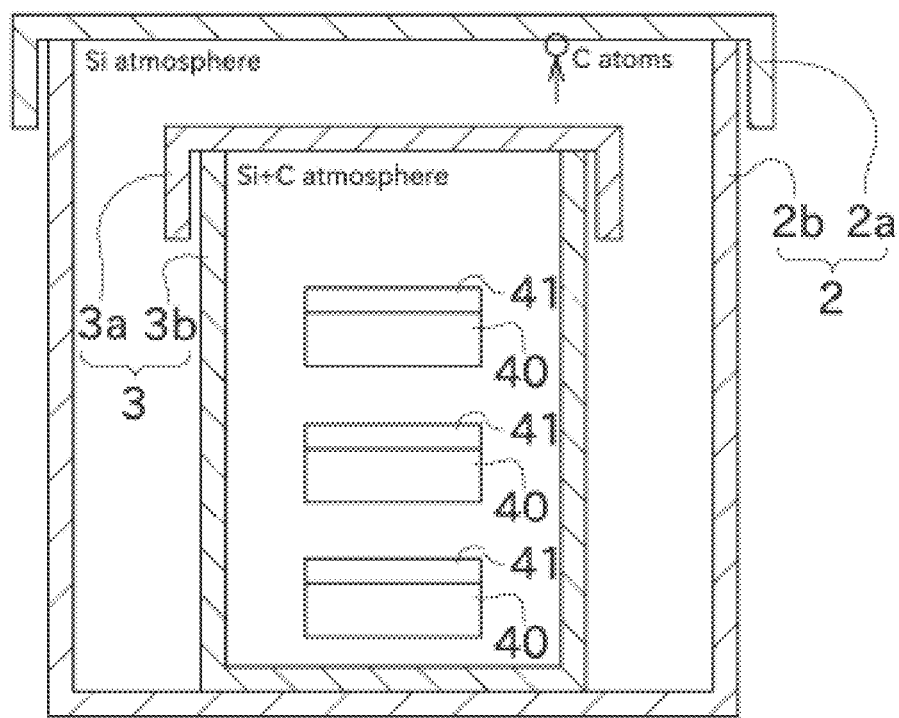
FIG. 11 A cross-sectional schematic view illustrating a state in which 3C—SiC epitaxial layers are formed at the same time on a plurality of underlying substrates.

FIG. 11 illustrates an embodiment in which a plurality of underlying substrates 40 are housed in one SiC container 3 that is housed in a TaC container 2. As described above, since the epitaxial layers 41 of single crystalline 3C—SiC having similar growth velocities and qualities can be formed independently of the position of the SiC container 3 by using the method of an aspect of the present invention, substrates with the epitaxial layers 41 can be efficiently formed.

As described above, in this embodiment, in a state in which the SiC container 3 of a material including polycrystalline SiC is housed in the TaC container 2 of a material including TaC and the underlying substrates 40 are housed in this SiC container 3, the TaC container 2 is heated with a temperature gradient in such a manner that the inside of the TaC container 2 is at a Si vapor pressure. Consequently, C atoms sublimated by etching of the inner surface of the SiC container 3 are bonded to Si atoms in an atmosphere in the SiC container 3, and thereby, the epitaxial layers 41 of single crystalline SiC (e.g., 3C—SiC, 4H—SiC, or 6H—SiC) grows on the underlying substrates 40.

Accordingly, a high-purity epitaxial layer 41 of single crystalline SiC can be formed at high velocity. In addition, since the material for the epitaxial layers 41 is the SiC container 3, the epitaxial layers 41 are allowed to grow uniformly, as compared to, for example, CVD in which a source gas is introduced.

In the vapor-phase epitaxial growth method of this embodiment, a material for the underlying substrate 40 may be an Al compound or a N compound, a material for the epitaxial layer 41 may be SiC, and an off-angle to the <11-20> direction or the <1-100> direction may be 1° or less.

Accordingly, with the method of an aspect of the present invention, the underlying substrate 40 is not limited to SiC, and thus, a versatile epitaxial growth method can be achieved. As a result, in a case where the underlying substrate 40 is SiC and the off-angle is small, a terrace expands, and a high-quality epitaxial layer of single crystalline SiC can be easily formed independently of crystalline polymorphism of the underlying substrate 40.

In the vapor-phase epitaxial growth method of this embodiment, the temperature gradient is preferably 2° C./mm or less.

Thus, with the method of an aspect of the present invention, the pressure of C atoms in the SiC container 3 is increased, and thus, an epitaxial layer is allowed to grow sufficiently even with a small temperature difference as described above. As a result, the heater and heating control can be simplified.

In the vapor-phase epitaxial growth method of this embodiment, the plurality of underlying substrates 40 are placed in the SiC container 3 and the epitaxial layer 41 is caused to grow on each of the plurality of underlying substrates 40.

Accordingly, the epitaxial layers 41 can be formed at the same time on the plurality of underlying substrates 40, and therefore the process can be performed efficiently. In particular, the use of the method of the aspect of the present invention enables the epitaxial layer 41 to be formed uniformly independently of the position in the SiC container 3, and thus, quality does not degrade.

In the vapor-phase epitaxial growth method of this embodiment, the inner surface of the TaC container 2 is made of Si or a Si compound, and Si atoms are sublimated from the inner surface of the TaC container 2 by heating during growth of the epitaxial layer 41 so that the inside of the TaC container 2 is at a Si vapor pressure.

Accordingly, a labor of an operator can be alleviated, as compared to a method of placing solid Si or the like in the TaC container 2. In addition, by forming Si or the like over a wide range of the inner surface of TaC, a uniform Si atmosphere can be obtained.

The foregoing description is directed to a preferred embodiment of the present invention, and the configuration described above may be changed, for example, as follows.

The shapes of the TaC container 2 and the SiC container 3 described above are examples, and may be changed as appropriate. For example, the TaC container 2 and the SiC container 3 may have different shapes or may have the same (analogous) shape. As illustrated in FIG. 8(d), the TaC container 2 or the SiC container 3 may have a plurality of spaces. One TaC container 2 may house a plurality of SiC containers 3, and each of the SiC containers 3 may house a plurality of underlying substrates 40 so that the epitaxial layers 41 can be formed thereon.

For example, to control the amount of growth of the epitaxial layer 41 accurately, an inert gas (e.g., an Ar gas) may be introduced during formation of the epitaxial layer 41 to reduce the growth velocity of the epitaxial layer 41.

Atmospheres of the internal space of the TaC container 2 and the internal space of the SiC container 3 (especially partial pressures of Si and C) vary depending on the amount of the Si source, the degree of carbon adsorption function of TaC, the volume of the TaC container 2, the volume of the SiC container 3, and so forth. Thus, by making these factors different from one another, the growth velocity and quality, for example, of the epitaxial layer 41 can be controlled.

REFERENCE SIGNS LIST

2 TaC container
2a upper container
2b lower container
3 SiC container
3a upper container
3b lower container
11 high-temperature vacuum furnace
40 SiC substrate
41 epitaxial layer
45 polycrystalline SiC plate

The invention claimed is:

1. A method of using a SiC container in which Si vapor and C vapor are generated in an internal space therein during a heat treatment, wherein the SiC container serves as a raw material for a growth of an underlying substrate and is a fitted container including an upper container and a lower container that are fitted together, the method comprising:
    housing a SiC substrate as the underlying substrate in an internal space of the SiC container; and
    heating the SiC container with Si atmosphere around the SiC container, such that Si vapor enters the internal space of the SiC container through a gap between the upper container and the lower container,
    wherein an outside atmosphere of the SiC container has an equilibrium vapor pressure of Si, and
    wherein a partial pressure of vapor containing C atoms in an internal atmosphere of the SiC container is higher than that in the outside atmosphere of the SiC container.

2. The method of using a SiC container according to claim 1, wherein
    the SiC container is heated in Si atmosphere to grow an epitaxial layer of single crystalline SiC on the underlying substrate housed in the internal space of the SiC container.

3. The method of using a SiC container according to claim 1, wherein
    the SiC container is heated in a TaC container of a material including TaC supplemented with a source of Si to grow an epitaxial layer of single crystalline SiC on the underlying substrate housed in the internal space of the SiC container.

4. The method of using a SiC container according to claim 1, wherein
    the SiC container is configured to include polycrystalline SiC.

5. The method of using a SiC container according to claim 1, which comprises a vapor-phase epitaxial growth method for performing an epitaxial layer growth step, wherein in a state in which a SiC container of a material including polycrystalline SiC is housed in a TaC container of a material including TaC and in which the underlying substrate is housed in the SiC container, the TaC container is heated with a temperature gradient such that inside of the TaC container is at a Si vapor pressure from a Si source disposed on an inner wall of the TaC container or in the TaC container, and C atoms sublimated by etching of an inner surface of the SiC container are bonded to Si atoms in an atmosphere, thereby causing an epitaxial layer of single crystalline SiC to grow on the underlying substrate.

6. The method of using a SiC container according to claim 1, wherein the internal space of the SiC container is a quasi-closed system during the heat treatment.

\* \* \* \* \*